United States Patent [19]
Jun

[11] Patent Number: 5,427,982
[45] Date of Patent: Jun. 27, 1995

[54] METHOD FOR FABRICATING A SEMICONDUCTOR DEVICE

[75] Inventor: Young K. Jun, Seoul, Rep. of Korea

[73] Assignee: Goldstar Electron Co., Ltd., Chungcheongbuk, Rep. of Korea

[21] Appl. No.: 284,862

[22] Filed: Aug. 2, 1994

[30] Foreign Application Priority Data

Jan. 12, 1994 [KR] Rep. of Korea .................. 1994-425

[51] Int. Cl.⁶ .......................................... H01L 29/49
[52] U.S. Cl. ................... 437/195; 437/188; 437/197
[58] Field of Search ............... 437/195, 197, 198, 199, 437/203, 188; 148/DIG. 107, DIG. 108

[56] References Cited

U.S. PATENT DOCUMENTS

| | | | |
|---|---|---|---|
| 4,587,138 | 5/1986 | You et al. | 437/188 |
| 4,728,627 | 3/1988 | Mase et al. | 437/190 |
| 4,927,783 | 5/1990 | Arai et al. | 437/197 |
| 5,169,803 | 12/1992 | Miyakawa | 437/197 |
| 5,229,325 | 7/1993 | Park et al. | 437/195 |
| 5,250,468 | 10/1993 | Matsuura et al. | 437/195 |
| 5,288,664 | 2/1994 | Mukai | 437/195 |
| 5,332,924 | 7/1994 | Kobayashi | 437/228 |

FOREIGN PATENT DOCUMENTS 5109715  4/1993  Japan .................. 437/198

*Primary Examiner*—Tom Thomas
*Assistant Examiner*—Michael Trinh
*Attorney, Agent, or Firm*—Finnegan, Henderson, Farabow, Garrett & Dunner

[57] ABSTRACT

A method for the fabrication of semiconductor device includes the steps of forming a first wiring layer on an insulating film overlaying a semiconductor substrate, depositing an interlayer insulating film entirely on the first wiring layer, etching the interlayer insulating film selectively to form a contact hole exposing the first wiring layer therethrough, forming a metal film on the interlayer insulating film and in the contact hole, etching the metal film selectively to leave the metal film only around the contact hole, depositing a mid-insulating film on the remaining metal film and on the interlayer insulating film applying annealing to the metal film to form a metal plug in the contact hole, the metal film filling the contact hole, removing the mid-insulating film and forming a second wiring layer on the interlayer insulating film and on the metal plug.

12 Claims, 6 Drawing Sheets

METHOD FOR FABRICATING A SEMICONDUCTOR DEVICE

BACKGROUND OF THE INVENTION

1. Field of the Invention

The present invention relates, in general, to a method for fabricating a semiconductor device and, more particularly, to a method for forming a multilayer-wiring structure in a semiconductor device.

2. Discussion of the Related Art

To achieve highly integrated semiconductor devices with high operating speed, pattern dimension of the semiconductor devices has been progressively miniaturized. In particular, in a formation process for a multilayer-wiring structure in a semiconductor device, as the width of the wiring layers becomes narrower and the distance between the layers becomes shorter, the size of contact hole needs to be finer.

Recently, a reactive ion etching (hereinafter, "RIE") process has been employed for forming a contact hole, which is poor in side etch and is superior in etch control.

Conventional methods for forming a two-layer wiring structure, including the formation of contact hole by use of the RIE, have been proposed and are discussed below.

FIGS. 1a–1d show a stepwise illustration of a conventional method for forming a multilayer wiring structure in a semiconductor device.

As shown in FIG. 1a, a thermal oxidation process is applied to a substrate 1 to form a silicon oxide film 12. Al—Si is deposited on the silicon oxide film 12 and then subjected to patterning to form a first wiring layer 13 consisting of a plurality of parallel, spaced-apart wirings. On the entire resulting structure, a nitride film 14 is formed, as an insulating film, using a plasma process.

To plane the surface of the nitride film 14, a silica solution is coated on the surface thereof, and an annealing process is applied to the silica solution to form a silica insulating film 15, as shown in FIG. 1b.

On the silica insulating film 15, as shown in FIG. 1c, a photoresist is coated, which is subsequently subjected to exposure and development using a conventional photo-etching process to form a photoresist pattern 16. Utilizing the photoresist pattern 16 as a mask, the RIE process is carried out to selectively etch the silica insulating film 15 and the nitride film 14. As a result, a contact hole 17 is formed, exposing the first wiring 13 therethrough.

After the photoresist pattern 16 is removed., as shown in FIG. 1d, Al—Si is deposited on the entirety of the silica insulating film 15, including the contact hole 17, using a conventional sputtering process and then is subjected to patterning to form a second wiring layer 18. As a result, a semiconductor device having a two-layer wiring structure is fabricated.

However, problems exist in the above-mentioned conventional method. For example, it is necessary to incline the side wall of the contact hole 17, which is formed from an interlayer insulating film consisting of the nitride film 14 and the silica insulating film 15, at angles ranging from about 45° to about 55° to prevent the second wiring layer 18 from shorting the contact hole 17. Taking into account the area ratio of the photoresist pattern 16 to the nitride film 14, the etching speed, and the stability of the etched state, the second wiring layer 18 formed on the side wall of the contact hole 17 of the interlayer insulating film, consisting of the nitride film 14 and the silica insulating film 15, becomes thin due to the steepness of the side wall of the contact hole 17, as shown in FIG. 1c. In such a thin portion of the second wiring layer, a short can easily occur due to high current density therein.

In addition, provided that the interlayer insulating film, consisting of the nitride film 14 and the silica insulating film 15, is thick, the variations in etching dimension becomes large due to the recession in the photoresist 16. Accordingly, it becomes difficult to make the contact hole finer.

In an effort to solve these problems, a method for forming a multilayer wiring structure has been disclosed in the Korean Patent Publication No. 90-1834 to Mase Yaskaz et al. This method is explained with reference to FIGS. 2a through 2e.

First, on a substrate 1, as shown in FIG. 2a, a silicon oxide film 2 is formed, on which an Al—Si alloy is subsequently deposited and is patterned with a photo-etching process using a photosensitive film 4 to form a first wiring layer 3.

After the photosensitive film 4 is removed, as shown in FIG. 2b, a plasma chemical vapor deposition (CVD) process is carried out many times to form thick nitride films 5 and 6 at not more than 300° C., at which protrusions are not generated. A silica insulating film 7 is formed on the nitride film 6 to plane or smooth stepped parts caused by the first wiring layer 3.

Next, as shown in FIG. 2c, a photosensitive film is coated on the silica insulating film 7 and is then exposed and developed with a photo-etching process to form a photosensitive film pattern 8. Using the photosensitive film pattern 8 as a mask, the silica insulating film 7 and the nitride films 5 and 6 are etched, in that order, to form a contact hole 9 exposing the first wiring layer therethrough.

After the photosensitive film pattern 8 is removed, as shown in FIG. 2d, an annealing process is carried out at 500° C. for 15 minutes to form a protrusion 10 on the first wiring layer 3 exposed in the contact hole 9. The formation of the protrusion 10 is due to a "hillock" phenomenon of Al constituting the first wiring layer.

Finally, as shown in FIG. 2e, another Al—Si alloy is deposited on the entirety of the structure resulting from FIG. 2d to form a second wiring layer 11, which contacts the first wiring layer 3 in the contact hole 9.

The method of Mase Yaskaz et al. takes advantage of the Al "hillock" phenomenon generated from annealing Al to fill the contact hole 19, leading to the connection of the lower wiring with the upper wiring.

However, since the first wiring layer is used to form the protrusion (Al "hillock"), there is generated a void caused by the motion of Al in the portion of the wiring adjacent to the protrusion 10, damaging the wiring. In addition, the size of the protrusion cannot be controlled, and hence, the method of Mase Yaskaz et al. is inferior in reproducibility and homogeneity.

SUMMARY OF THE INVENTION

Therefore, an object of the present invention is to overcome the above problems encountered in the prior art and to provide a method for fabricating a semiconductor device, superior in coating stepped parts and in reducing wiring resistance.

In accordance with the present invention, the objects and advantages can be accomplished by providing a method for fabricating a semiconductor device comprising the steps of forming a first wiring layer on an insulating film overlaying a semiconductor substrate; depositing an interlayer insulating film entirely on the first wiring layer; etching the interlayer insulating film selectively to form a contact hole exposing the first wiring layer therethrough; forming a metal film on the interlayer insulating film and in the contact hole; etching the metal film selectively to leave the metal film only around the contact hole; depositing a mid-insulating film on the remaining metal film and on the interlayer insulating film; annealing the metal film to form a metal plug in the contact hole, the metal film filling the contact hole; removing the mid-insulating film; and forming a second wiring layer on the interlayer insulating film and on the metal plug.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
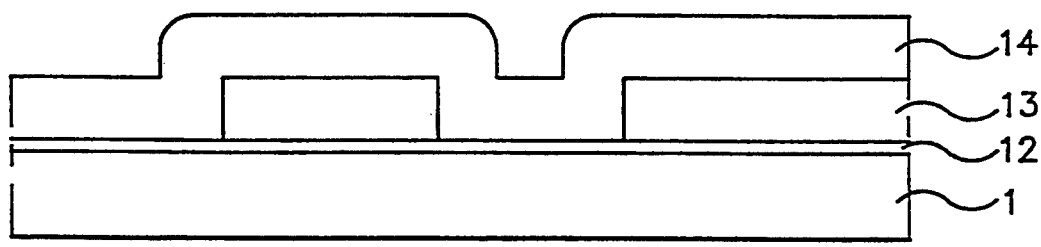
FIGS. 1a through 1d are schematic, cross-sectional views showing a conventional method for forming a multilayer wiring structure in a semiconductor device.
Figure 1B:
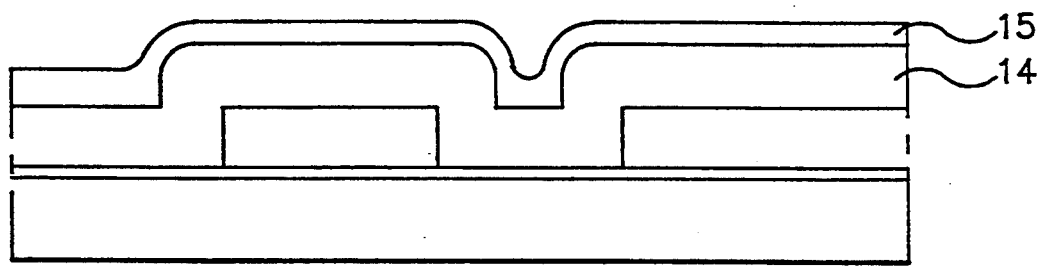
Figure 1C:
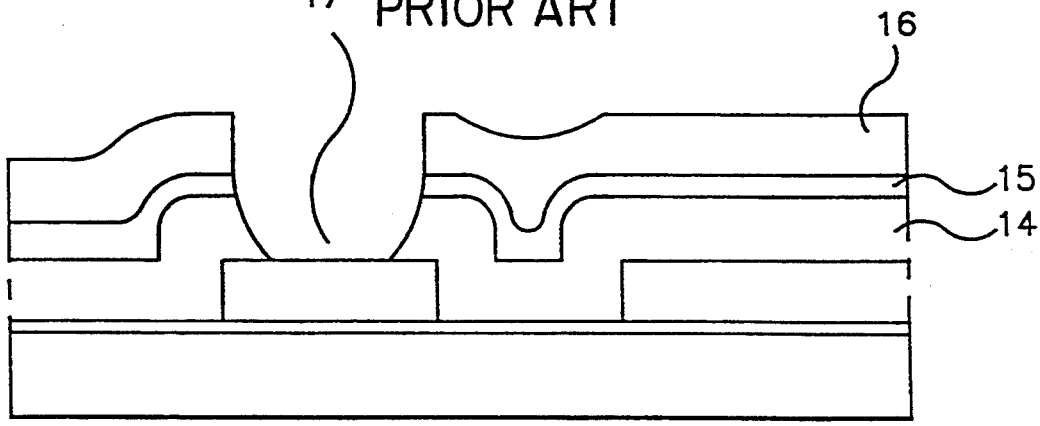
Figure 1D:
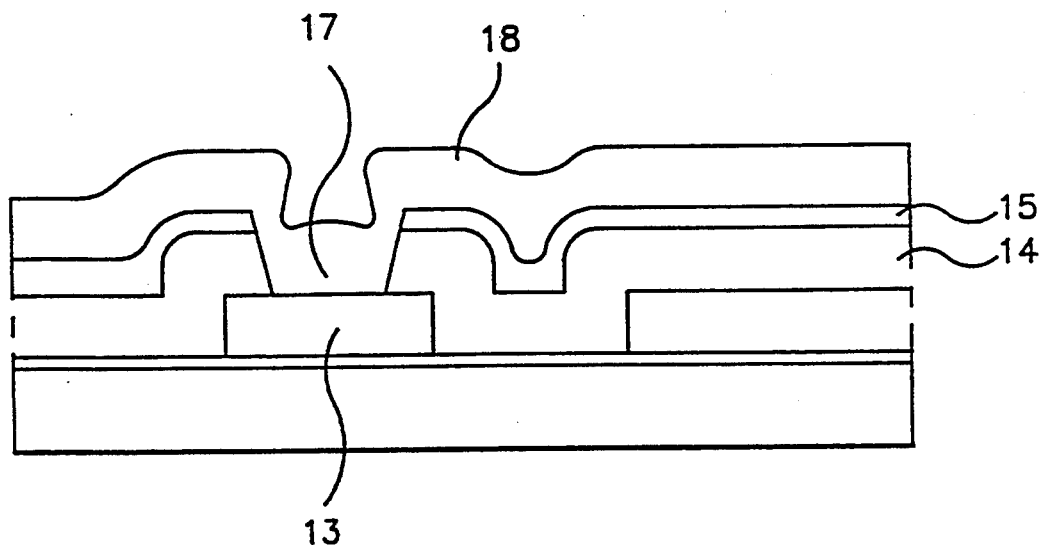
Figure 2A:
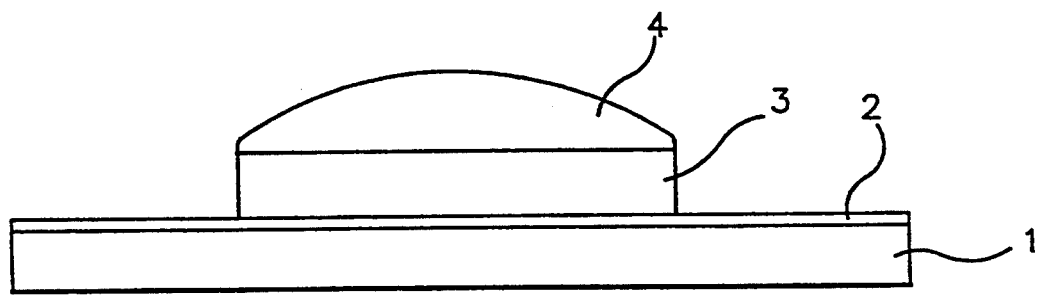
FIGS. 2a through 2e are schematic, cross-sectional views showing another conventional method for forming a multilayer wiring structure in a semiconductor device.
Figure 2B:
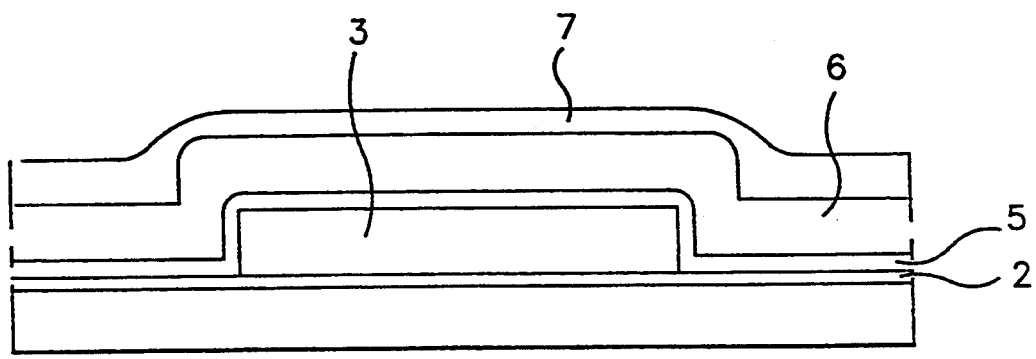
Figure 2C:
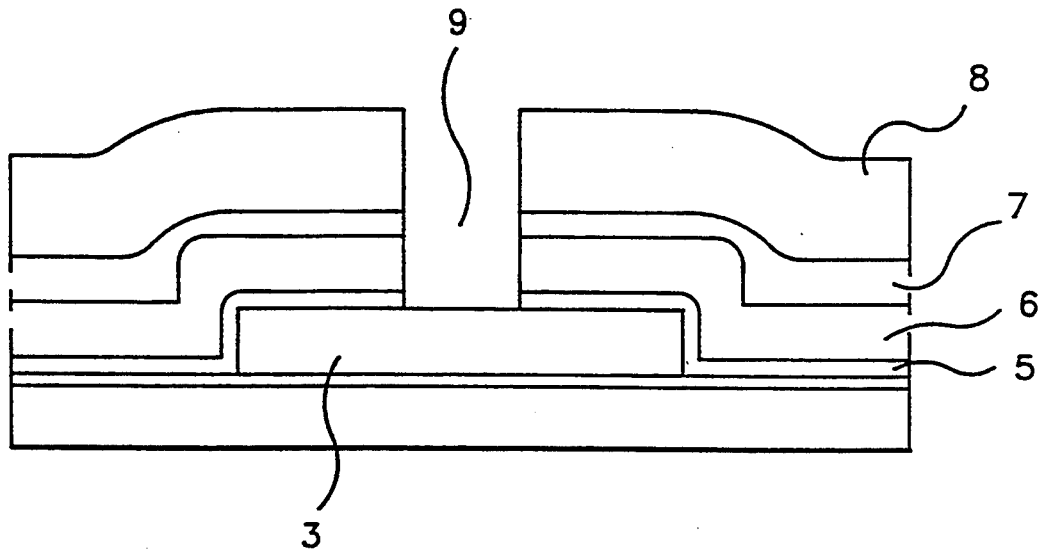
Figure 2D:
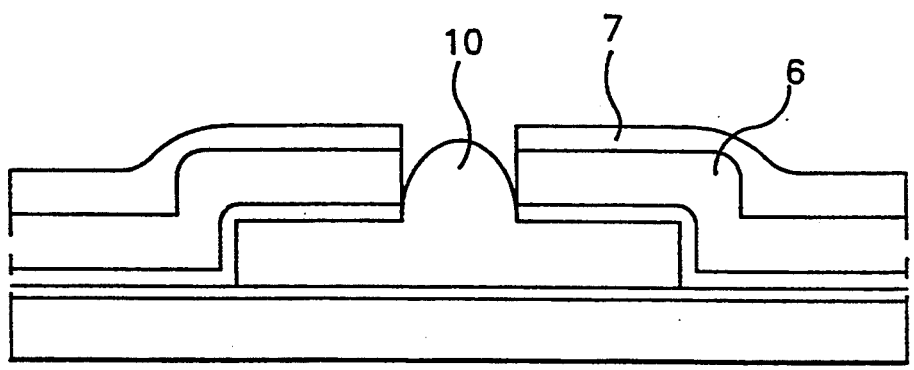
Figure 2E:
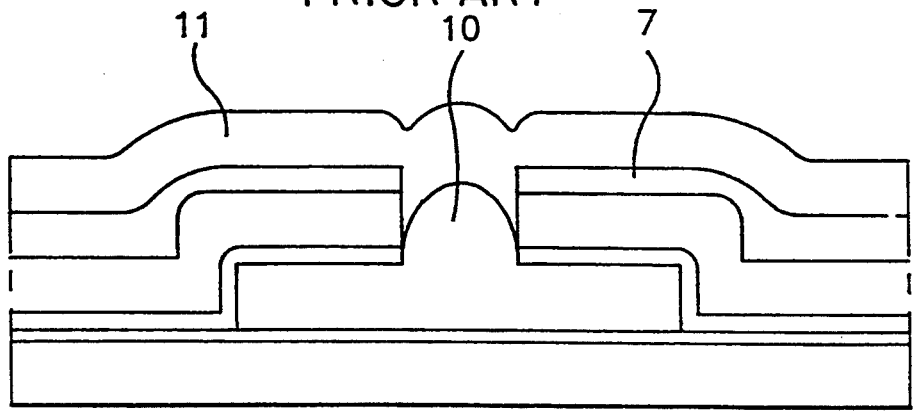

In accordance with the method of the present invention, an interlayer pad metal layer is buried in a contact hole in a mechanical or thermal flow manner, to form a metal plug which is planed as well as to decrease wiring damage.

The preferred embodiments of the present invention will be described with reference to the accompanying drawings, wherein like reference numerals designate like parts, respectively.

Referring to FIGS. 3a through 3h, a method is illustrated for forming wirings in a semiconductor device according to a first embodiment of the present invention.

Figure 3A:
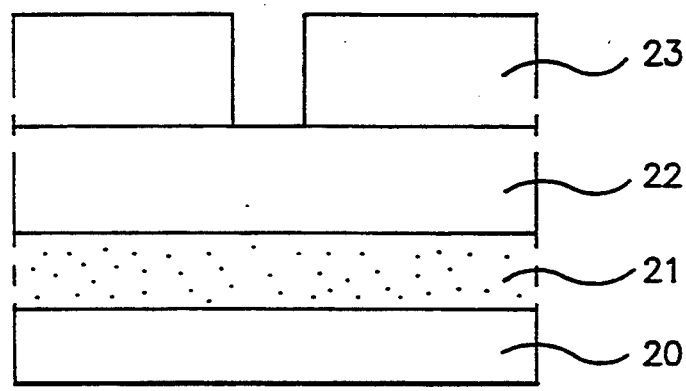
FIGS. 3a through 3h are schematic, cross-sectional views showing a method for forming a multilayer wiring structure in a semiconductor device according to a first embodiment of the present invention.

As shown in FIG. 3a, on a device-formed semiconductor (not shown) an insulating film 20, for example, oxide film, is formed which is covered with a conductive film for forming a wiring layer. An Al alloy film is a preferred conductive film. The Al alloy film is deposited by a general sputtering process at thicknesses ranging from approximately 0.5 $\mu$m to approximately 1.0 $\mu$m. The conductive film is patterned with a photo-etching process to form a first wiring layer 21. The shape of the patterned first wiring layer is not, shown in the figure. A gas containing $Cl_2$ is preferred as an etching gas for the Al alloy.

Not only the conductive film, which is formed by depositing a metal and patterning it as stated above, but also an impurity-diffused region formed on a semiconductor substrate, that is, a source region or a drain region, may be the first wiring layer 21. For the latter case, a second wiring layer, which is to be formed in subsequent processes, becomes a primary wiring layer connected to the impurity-diffused region.

Using a chemical vapor deposition (hereinafter, "CVD") or a plasma enhanced chemical vapor deposition (hereinafter, "PECVD") process, an interlayer insulating film 22, for example, an oxide film, a nitride film, or a laminated film consisting of an oxide film and a nitride film, is formed at a thickness of approximately 1 $\mu$m over the entire structure resulting from the above patterning. On the interlayer insulating film 22, there is coated a photosensitive film 23 which is subjected to exposure and development by a photo-etching process to form a desired contact hole pattern.

Figure 3B:
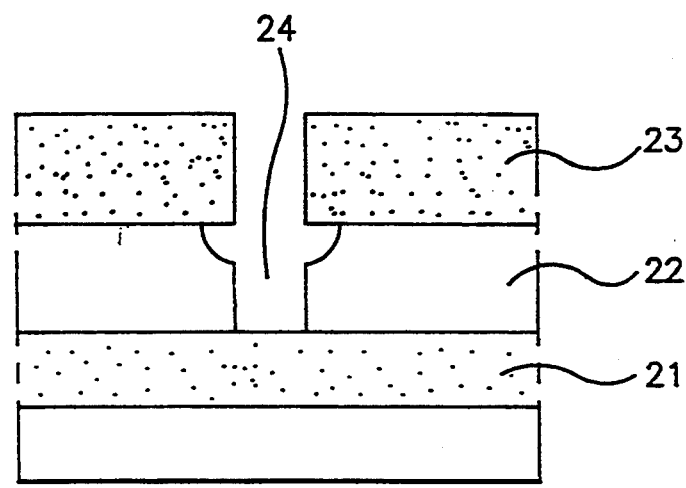

As shown in FIG. 3b, using the patterned photosensitive film 23 as a mask, an anisotropic etch process and an isotropic etch process are applied to the interlayer insulating film 22 to form a contact hole 24 and exposing a predetermined portion of the first wiring layer 21 therethrough.

If the interlayer insulating film 22 is a type of an oxide film, the anisotropic etch process employs a gas containing $CHF_3$ or $CF_4$, whereas the isotropic etch process employ a wet etching solution, such as a solution containing HF. If the interlayer film 22 is a type of a nitride film, the anisotropic etch process utilizes a gas containing $CHF_3$ or $CF_4$, whereas the isotropic etch process utilizes a wet etching solution, such as a solution containing phosphoric acid. The etching processes for the laminated structure of the oxide film and the nitride film employ an etching gas and an etching solution suitable for the films, respectively.

As a result of the anisotropic and isotropic etching of the interlayer insulating film, the contact hole 24 is formed in such a way that an upper portion thereof is wider than a lower portion.

Figure 3C:
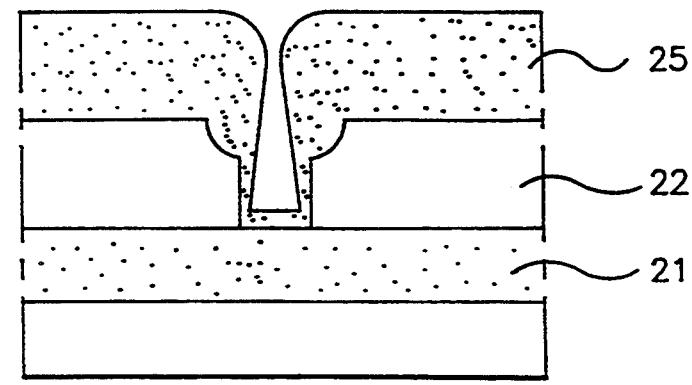

After the photosensitive film pattern 23 is removed, as shown in FIG. 3c, an interlayer pad metal layer 25 is deposited on the entire interlayer insulating film 22, including the contact hole 24, at thicknesses ranging from approximately 3,000 Å to approximately 10,000 Å, using a general sputtering process. A preferred material for the interlayer pad metal layer 25 include Al and Al alloy.

Figure 3D:
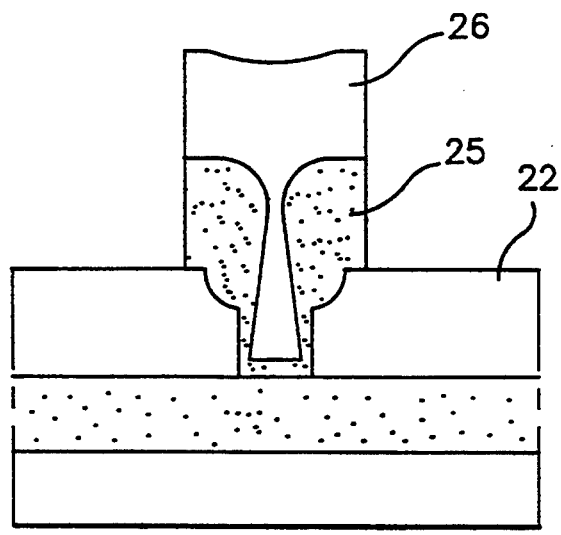

On the interlayer pad metal layer 25, as shown in FIG. 3d, there is formed a photosensitive film, which is subsequently exposed and developed by a photo-etching process, to form a photosensitive film pattern 26, which then serves to mask the interlayer pad metal layer 25 formed on a predetermined portion including the contact hole 24 when the interlayer pad metal layer 25 is etched. This etching process is carried out in such a way that the volume of the interlayer pad metal layer 25 remaining around the contact hole portion is the same as or larger than that of the internal space of the contact hole.

Figure 3E:
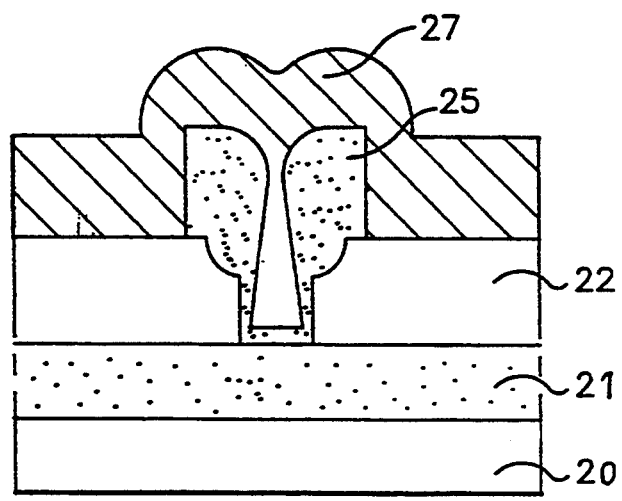

On the entire structure resulting from removing the photosensitive film pattern 26, as shown in FIG. 3e, there is entirely deposited a mid-insulating film 27 at thicknesses ranging from approximately 5,000 Å to approximately 10,000 Å, using the CVD or PECVD method. A preferred material for the mid-insulating film 27 includes an oxide film and a nitride film.

Figure 3F:
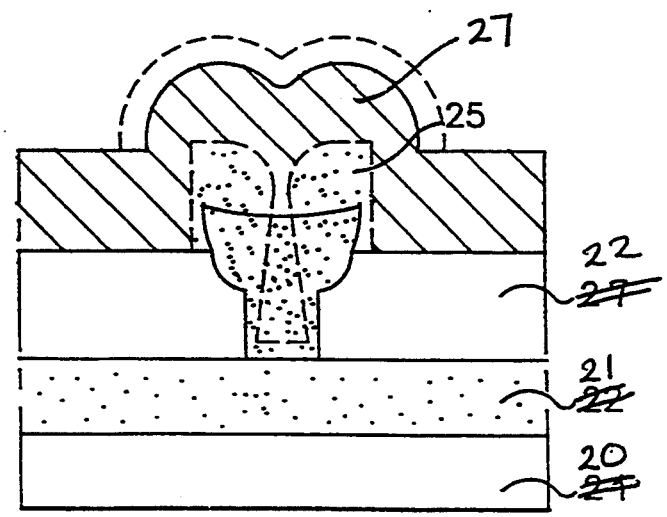

Under an ambient inert gas, such as $N_2$ or Ar, or ambient reductive gas such as $H_2$, an annealing process is carried out at temperatures ranging from approximately 350° to approximately 600° C. for 1 to 30 minutes, so as to cause the interlayer pad metal layer 25 to flow and fill the contact hole 24, as shown in FIG. 3f.

Lower annealing temperatures, for example, from 350° C. to 450° C. allows the insulating films 22 and 27 surrounding the interlayer pad metal layer 25 to cause a compressive stress in the interlayer pad metal layer 25, leading to a mechanical flow of the interlayer pad metal layer 25 into the central space of the contact hole 24, the weakest portion to the flow.

In addition, at higher annealing temperatures, for example, ranging from 500° to 600° C., the mechanical flow is generated along with a liquid flow resulting from the melting of the Al alloy constituting the interlayer pad metal layer 25, filling the central space of the contact hole.

Figure 3G:
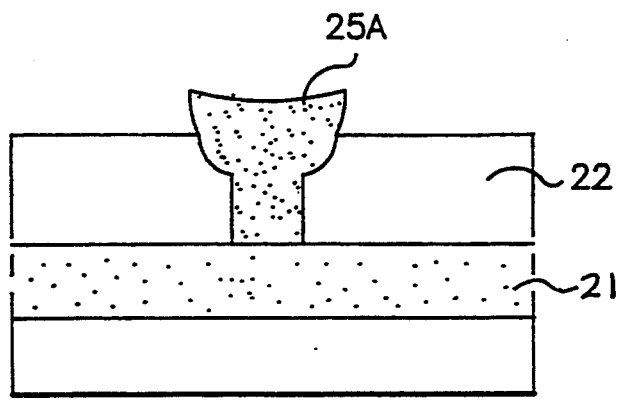

As shown in FIG. 3g, the mid-insulating film 27 is removed by wet etching to form a metal plug 25A for connecting wiring layers.

Figure 3H:
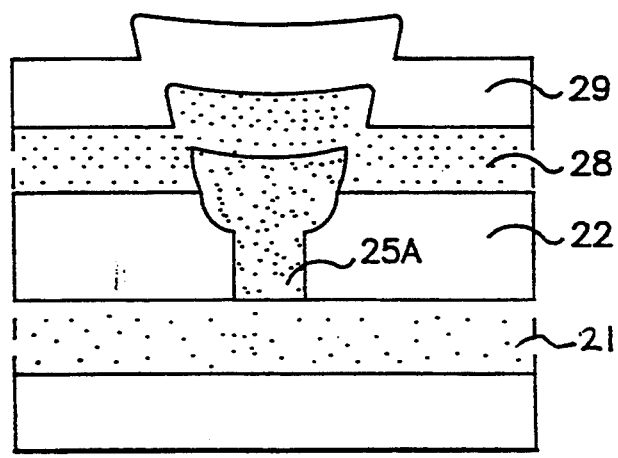

As shown in FIG. 3h, a conductive film for a wiring layer is formed on the metal plug 25A and the interlayer insulating film 22 at a thickness of 5,000 Å to 10,000 Å, using a general sputtering process, and is then subjected to patterning to form a second wiring layer 28. The second wiring layer 28 is connected to the first wiring layer 21 through the metal plug 25A formed in the contact hole. Preferred conductive layer includes an Al alloy. The second wiring layer 28 is protected by a protective insulating film 29.

Figure 4A:
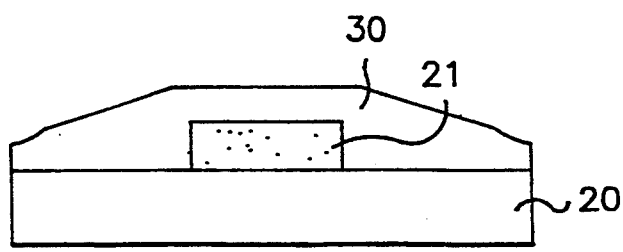
FIGS. 4a and 4b are schematic, cross-sectional views showing a method for forming a multilayer wiring structure in a semiconductor device according to a second embodiment of the present invention.
Figure 4B:
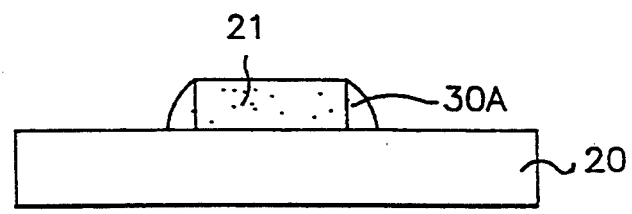

In FIGS. 4a and 4b, another embodiment of the present invention is illustrated.

As shown in FIG. 4a, spin on glass or polyimide is coated to form an insulating film 30 for the planarization or smoothing of the stepped parts, before the formation of the interlayer insulating film 22 in FIG. 3a. Alternatively, as shown in FIG. 4b, the insulating film 30 formed may be subjected to etch back to allow the insulating film 30 to remain only at the side wells of the first wiring layer 21.

As described above, the present invention takes advantage of the interlayer pad metal layer and the mid-insulating film to form the metal plug in the contact hole, thereby greatly enhancing the reproducibility and homogeneity of semiconductor devices fabricated according to the method.

In addition, the wiring layer is prevented from being damaged, by the metal flow according to the present invention, thereby improving device reliability.

Although the preferred embodiment of the present invention has been disclosed for illustrative purposes, those skilled in the art will appreciate that various modifications, additions and substitutions are possible, without departing from the scope and spirit of the present invention as disclosed in the accompanying claims.

What is claimed is:

1. A method for fabricating a semiconductor device, the method comprising the steps of:
   providing an insulating film over a semiconductor substrate;
   forming a first wiring layer on the insulating film;
   depositing an interlayer insulating film on the entirety of said first wiring layer;
   etching said interlayer insulating film selectively to form a contact hole exposing said first wiring layer therethrough;
   forming a metal film on said interlayer insulating film and in said contact hole;
   etching said metal film selectively so that said metal film remains only around said contact hole;
   depositing a mid-insulating film on said remaining metal film and on said interlayer insulating film;
   annealing said metal film to form a metal plug in said contact hole, said metal film filling said contact hole;
   removing said mid-insulating film; and
   forming a second wiring layer on said interlayer insulating film and on said metal plug.

2. A method according to claim 1, wherein said contact hole is formed having an upper portion and a lower portion, said upper portion being wider than the lower portion.

3. A method according to claim 1, wherein said step of etching said interlayer insulating film comprises the steps of:
   forming a photosensitive film on said interlayer insulating film;
   selectively exposing and developing said photosensitive film to form a photosensitive pattern;
   applying anisotropic etching and isotropic etching to said interlayer insulating film, said photosensitive film pattern serving as a mask.

4. A method according to claim 1, wherein said metal film is formed with one of an Al film and an Al alloy film.

5. A method according to claim 1, wherein said metal film remaining around said contact hole is formed having a thickness and a volume, the volume being the same as or larger than that of an internal space of said contact hole.

6. A method according to claim 1, wherein said mid-insulating film is a nitride film.

7. A method according to claim 1, wherein said annealing is carried out at a temperature in the range of approximately 350° C. to 600° C. for a duration of approximately 1 to 30 minutes under an ambient inert gas or an ambient reductive gas.

8. A method according to claim 1, wherein said step of annealing causes said metal film to flow into an internal space of said contact hole to form said metal plug.

9. A method according to claim 1, further comprising the step of forming a second insulating film for planarizing stepped parts caused by the formation of said first wiring layer before the deposition of said interlayer insulating film.

10. A method according to claim 9, wherein said second insulating film is formed with spin on glass or polyimide.

11. A method according to claim 1, further comprising the steps of:
    forming a second insulating film for planarizing stepped parts caused by said first wiring layer before said interlayer insulating film; and
    applying etch back to said second insulating film.

12. A method according to claim 11, wherein said second insulating film is formed with spin on glass or polyimide.

* * * * *